United States Patent
Rajsuman et al.

(10) Patent No.: US 6,791,316 B2
(45) Date of Patent: Sep. 14, 2004

(54) HIGH SPEED SEMICONDUCTOR TEST SYSTEM USING RADIALLY ARRANGED PIN CARDS

(75) Inventors: Rochit Rajsuman, Santa Clara, CA (US); Hiroaki Yamoto, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/253,724

(22) Filed: Sep. 24, 2002

(65) Prior Publication Data

US 2004/0056677 A1 Mar. 25, 2004

(51) Int. Cl.$^7$ .............................................. G01R 31/02
(52) U.S. Cl. .................................... 324/158.1; 324/765
(58) Field of Search ............................. 324/158.1, 73.1, 324/763–765, 750–753; 714/733–734

(56) References Cited

U.S. PATENT DOCUMENTS

| | | | |
|---|---|---|---|
| 4,862,075 A | * | 8/1989 | Choi et al. .................. 324/753 |
| 5,898,326 A | | 4/1999 | Okayasu |
| 6,016,566 A | | 1/2000 | Yoshida |
| 6,133,725 A | * | 10/2000 | Bowhers .................. 324/158.1 |
| 6,331,770 B1 | | 12/2001 | Sugamori |

* cited by examiner

*Primary Examiner*—Vinh P. Nguyen
(74) *Attorney, Agent, or Firm*—Muramatsu & Associates

(57) ABSTRACT

A high speed semiconductor test system is so designed that pin cards in a test head are arranged in radial directions where the DUT is placed over the center of the test head. Since each of the pin cards is arranged radially, the side which faces the center is close to the DUT, and time critical components in the pin card are formed in an area close to the side of that faces the center, thereby minimizing the round-trip-delay (RTD). Moreover, each pin card is distanced equally from the DUT. Thus, the variation in the length of path connecting between the pin card and the DUT is minimized, and accordingly, the variation in RTD is also minimized.

7 Claims, 9 Drawing Sheets

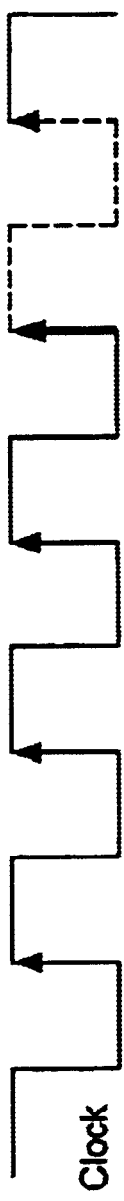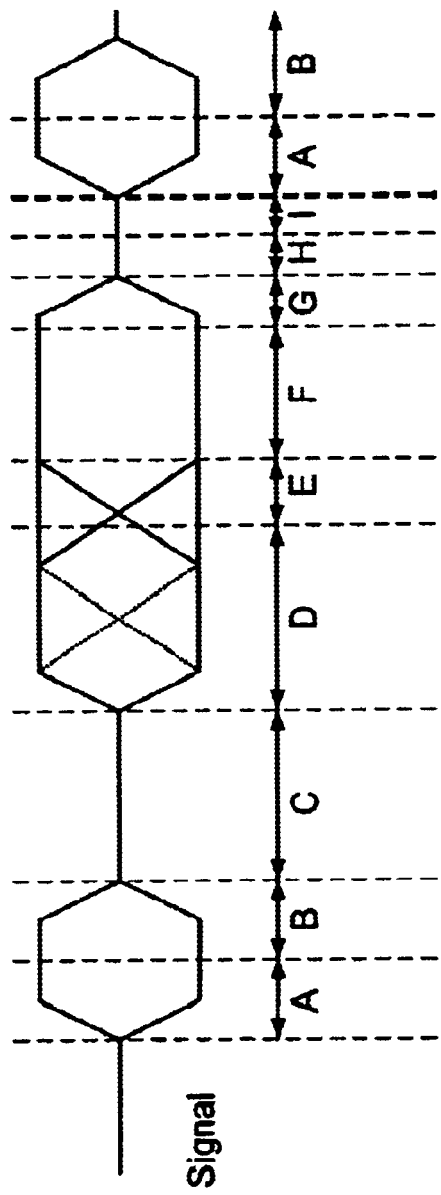
Fig. 3A
(Prior Art)
Fig. 3B
(Prior Art)

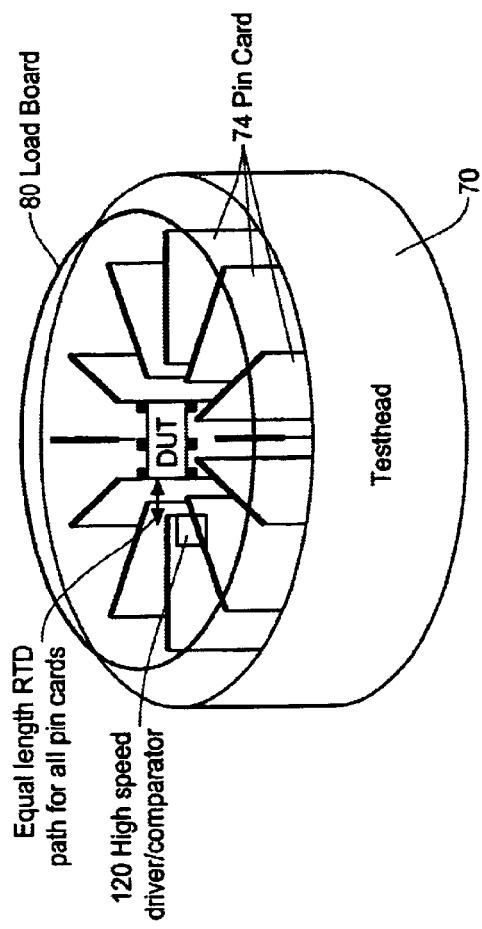
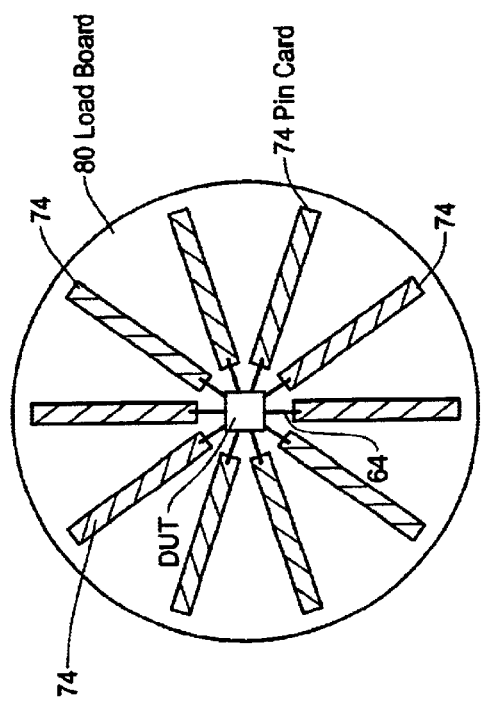
Fig. 5A
Fig. 5B

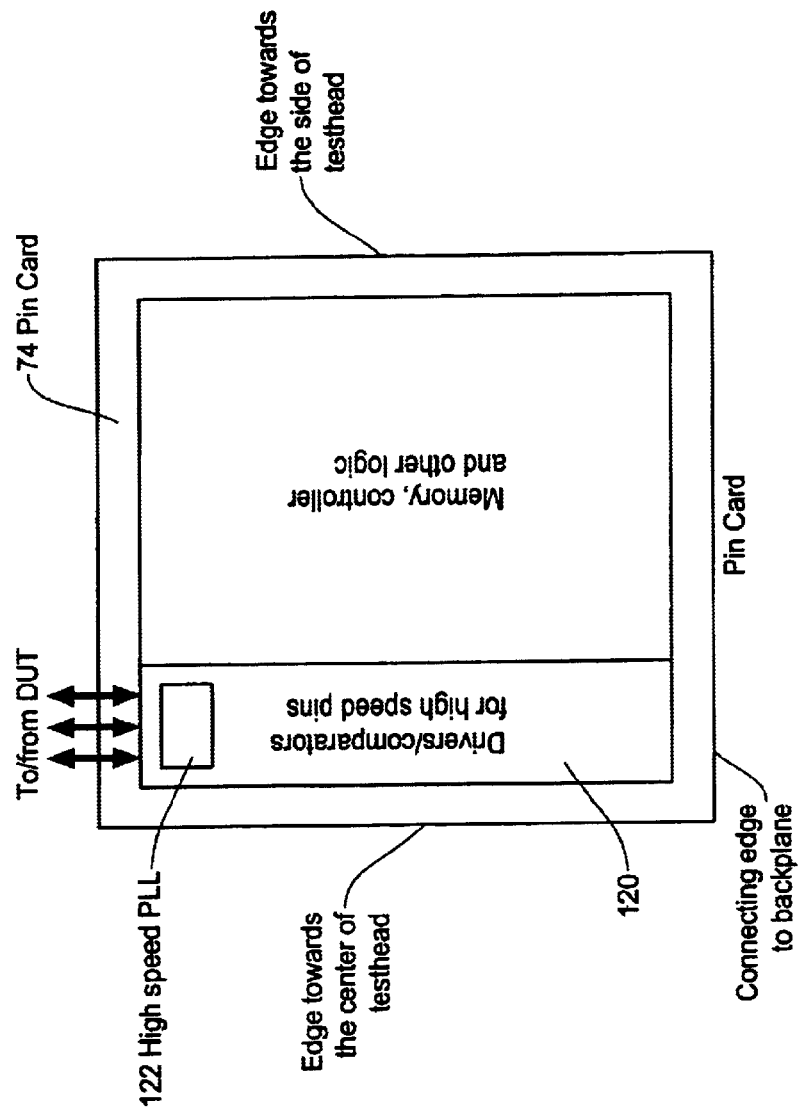

6,791,316 B2

HIGH SPEED SEMICONDUCTOR TEST SYSTEM USING RADIALLY ARRANGED PIN CARDS

FIELD OF THE INVENTION

This invention relates to a high speed semiconductor test system, and more particularly, to a high speed semiconductor test system having pin cards arranged radially in a test head to achieve equidistance and minimum round-trip-delay time (RTD) between a device under test (DUT) and drivers/comparators on the pin cards.

BACKGROUND OF THE INVENTION

In testing a semiconductor integrated circuit device (IC device) by a semiconductor test system (IC tester), an IC device under test is provided with test patterns (test vectors) produced by an IC tester at its appropriate pins at predetermined test timings. The IC tester receives output signals from the IC device under test in response to the test patterns. The output signals are strobed by strobe signals with predetermined timings and compared with expected data to determine whether the IC device functions correctly.

FIG. 1 is a schematic block diagram showing an example of basic configuration of an IC tester. In the example of FIG. 1, a test processor 11 controls an overall operation of the test system through a tester bus. Based on pattern data from the test processor 11, a pattern generator 12 provides timing data and waveform data to a timing generator 13 and a wave formatter 14, respectively. A test pattern is produced by the wave formatter 14 with use of the waveform data from the pattern generator 12 and the timing data from the timing generator 13. The test pattern is supplied to an IC device under test (DUT) 19 through a driver 15.

An output signal from the DUT 19 resulted from the test pattern is converted to a logic signal by a comparator 16 with reference to predetermined threshold voltage levels. The signal from the comparator 16 is compared with expected value data from the pattern generator 12 by a comparator 17. The result of the comparison is stored in a failure memory 18 corresponding to the address of the DUT 19. The driver 15, the comparator 16 and switches (not shown) for changing pins of the device under test, are provided in a pin electronics (pin card) 20.

The circuit configuration noted above is provided to each test pin of the semiconductor test system. For testing a large scale integrated circuit, an IC tester has a large number of test pins, such as from 256 to 1024 test pins. Therefore, the IC tester has a large number of pin electronics circuits 20 (drivers and comparators), for example, 256–1024, each being configured as shown in FIG. 1.

Such pin electronics cards (pin cards) are aligned in a test head of the semiconductor test system (IC tester) as shown in FIG. 2. Typically, a pin card includes drivers and comparators and other components of IC tester such as a timing generator (clock generator) and a wave formatter of FIG. 1 for each test pin. As shown in FIG. 2. a load board (performance board) 40 is mounted on a test head 30 of the IC tester. The IC device under test (DUT) 19 is mounted on the load board 40 through an IC socket (test socket) 45. In FIG. 2, as is well known in the art, an integrated circuit (DUT) is configured by an IC chip which is typically encapsulated by an IC package.

The general speed specifications of present day semiconductor integrated circuits (ICs) are on the order of GHz (giga-hertz). It is expected that the speed will increase to tens of GHz in the next few years. In order to test those high speed semiconductor integrated circuits, it is desirable that test patterns (test vectors) be applied at the speed corresponding to the speed of the ICs to be tested. Executing functional test vectors at the IC chip's specified speed at which it will operate is referred to as "at-speed testing" in the industry.

In the structure of FIG. 2, at chip operating speeds of 250 MHz or higher, a round-trip-delay (RTD) from the driver to DUT and back to the comparator prohibits the application of high-speed test vectors. As illustrated in FIG. 2, the path of RTD contains the device pin of DUT 19, socket pin of IC socket 45, trace on the load board 40 and the wire in the test head 30 to and from the driver 15 and comparator 16. In general, RTD is on the order of 2 ns (nanosecond) in the present day semiconductor test systems (IC testers).

The RTD time puts a restriction on the speed by which an IC tester can apply test vectors to a bi-directional pin of DUT. A bi-directional pin is an I/O (input/output) pin that switches between input and output modes. In testing such a bi-directional pin, the path between the device pin and the IC tester is shared between the tester driver 15 and tester comparator 16. Thus, the test pattern from the tester driver 15 is applied to the DUT 19 and the resultant signal is sent back to the comparator 16. Therefore, the drive signal from the tester driver 15 to the DUT 19 must wait until the DUT output data has reached the tester comparator 16 and the tri-state condition involved in the bi-direction pin has had enough time to propagate through this one way path.

Thus, to test a bi-directional pin of DUT, the switching speed from the input state to the output state of the bi-directional pin should be less than the physical delay over this path. FIGS. 3A and 3B illustrate a typical bi-directional signal timing. FIG. 3A shows a clock signal in the IC tester and FIG. 3B shows a waveform seen at the bi-directional pin of DUT 19. The waveform of FIG. 3B includes various time segments. The maximum frequency at which a tester can test is defined by:

Max Test Frequency=Setup time (A)=Active to tri-state interval time (G)=Data-to-tri-state-transition propagation time till it reaches the comparator (H)=Time for driver signal to reach DUT (I).

Although various time segments are illustrated in FIG. 3B, for simplicity and ease of explanation, only the components related to the present invention is explained. In this example, for simplicity, it is assumed that each of the time components H and I is equal to ½ RTD. Again, for simplicity, it is assumed that 1 ns (nanosecond) is incurred for set-up (component A in FIG. 3B) and 1 ns is incurred for active to tri-state time (component G in FIG. 3B). Thus, the total delay of 3 ns is obtained by adding components A, I, G, and H. This means that the maximum test frequency can be about 334 MHz (one tester period or clock of FIG. 3A=3 ns) even if the IC tester is capable of running the test at a higher speed such as 500 MHz. Thus, the testing speed is limited about 334 MHz despite the capability of the IC tester and the requirement of the DUT.

FIG. 4A is a perspective view showing an example of inner structure of a test head incorporated in a conventional semiconductor test system (IC tester). In the test head 52, a plurality of pin cards (pin electronics cards) 54 are mounted on a backplane 51 in a row, i.e., parallel fashion. A load board (performance board) 53 is mounted on the test head 52 where all or most of the pin cards 54 are connected to the load board 53. The DUT is inserted in an IC socket on the load board 53 and thus is connected the pin cards 54, although the connections (test fixture) are not shown in FIG. 4A to simplify the illustration.

As is apparent from FIG. 4A, the test head 52 is normally rectangular in shape in the conventional semiconductor test system. A large number of pin cards 54 are aligned in one direction in a parallel fashion as shown in FIG. 4B which is a top view of the test head 52 of FIG. 4A. The DUT is placed at the center of the test head 52 on the IC socket on the load board 53.

In FIG. 4B, because of the arrangement of the pin cards 54, the distance from the pin card to the DUT is different for each connection. For example, as shown in FIG. 4B, the line 61 connecting the left most pin card 54 to the DUT is much longer than the line 62 connecting the pin card 54 nearest to the DUT. Although only the line 61 and line 62 are shown in the drawings to simplify the view, other lines are connected from the pin cards 54 to the DUT. As apparent from the drawings, because the line 61 is long, the RTD through the line 61 is large which limits the test frequency as noted above.

Such differences of RTD also require a skew adjustment circuit for each channel to cancel the differences in the timings among the test pins. Since the arrangement of pin cards in the conventional technology of FIG. 4A causes large differences in RTP, each skew adjustment circuit requires a large delay time in the delay circuit formed therein, which increases hardware components. Such RTD variations can also restrict the freedom of design in the semiconductor test system. For example, when using pin cards with different operating speeds in the same test head, the designing process poses difficulty for positioning the pin cards in the test head.

To overcome the bi-directional signal timing problem noted above, techniques such as "dead cycles" or "fly-by" configuration are sometimes used (R. Rajsuman "System-on-a-Chip: Design and Test", Artech House, ISBN 1-58053107-5, 2000). The "dead cycles" are no operation instructions (NOP) inserted to the test vectors every time a device pin changes from the output mode to the input mode. The dead cycle involves an extra delay, which defeats the purpose of at-speed testing. In the "fly-by" configuration, additional test resources such as separate driver and comparator pins are required. This provides a one-way path from the tester driver to the DUT and from the DUT to the tester comparator. The "fly-by" method further requires a significant amount of manual work to accommodate the change and almost twice the number of tester channels. Either of these methods does not address to the reduction of RTD itself.

Thus, there is a need for a new structure in an IC tester for reducing RTD and increasing the test speed without involving complex additional configuration. Moreover, there is a need for a high speed IC tester wherein the RTD will not vary among the pin cards.

SUMMARY OF THE INVENTION

Therefore, it is an object of the present invention to provide a high speed semiconductor test system that has reduced round-trip-delay (RTD) between a pin card and the IC device under test (DUT).

It is another object of the present invention to provide a high speed semiconductor test system that has reduced RTD as well as identical distance between the DUT and pin cards by arranging the pin cards radially in the test head.

It is a further object of the present invention to provide a semiconductor test system having pin cards radially aligned in the test head where a pin card has different speeds of driver/comparators the locations of which on the pin card are determined on the basis of the speeds.

In the present invention, the pin cards in the test head are arranged in a radial direction where the DUT is placed at the center of the test head. Since each of the pin cards is arranged radially, the side which faces the center is close to the DUT, thereby reducing the round-trip-delay (RTD). Moreover, each pin card is distanced equally from the DUT. Thus, the variation in the length of path connecting between the pin card and the DUT is minimized or eliminated. Accordingly, the variation in RTD is also minimized or eliminated.

In another aspect of the present invention, the pin card has drivers/comparators with different speed, for example, high speed drivers and comparators and low speed drivers and comparators. The high speed drivers and comparators are formed at an inner edge of the pin card closest to the center of the test head while the low speed drivers and comparators are formed at an outer edge of the pin card. Thus, the high speed drivers and comparators have the shortest distance to the DUT, i.e., the smallest RTD. On the other hand, the low speed drivers and comparators have a larger distance since they do not require the shortest distance or smallest RTD. Thus, by installing the pin cards radially in the test head, the optimum distance and RTD can be achieved depending on the desired speed of the drivers and comparators.

BRIEF DESCRIPTION OF THE INVENTION

FIGS. 3A and 3B are timing charts involved in testing a bi-directional pin of DUT where FIG. 3A shows a waveform of a clock signal and FIG. 3B shows a signal waveform at the driver/comparator in the pin card.

FIG. 4A is a perspective view thereof and FIG. 4B is a top view thereof.

FIGS. 5A–5C are schematic diagrams showing examples of structure in the semiconductor test system of the present invention where pin cards are arranged radially with respect to the center of the test head. FIG. 5A is a perspective view and FIG. 5B is a top view of the test system, and FIGS. 5C and 5D are perspective views of backplane in the test head for mounting the pin cards.

FIG. 6 is a schematic diagram showing an example of pin card incorporated in the test system of the present invention where specific locations of circuit blocks such as driver/comparators are defined therein.

FIG. 7A is a perspective view thereof and FIG. 7B is a front view of pin card.

DETAILED DESCRIPTION OF THE INVENTION

Figure 5D:
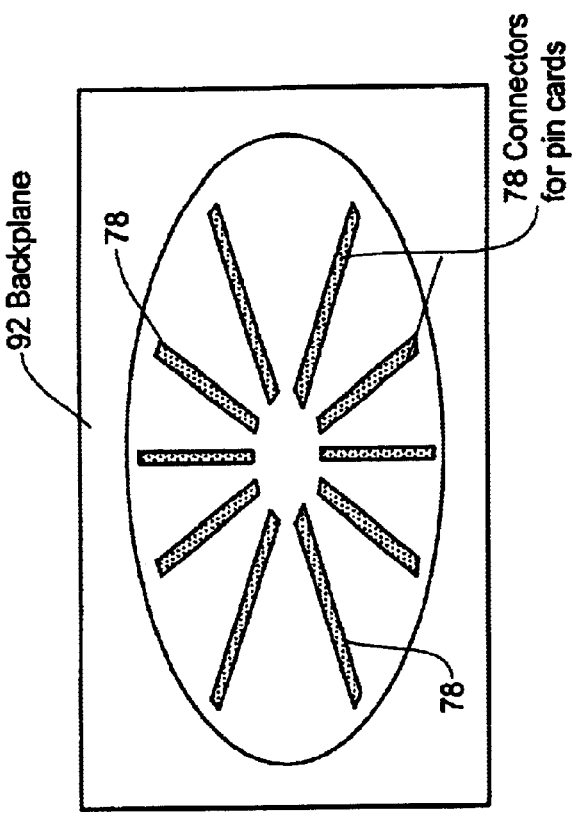

The present invention is explained in detail with reference to FIGS. 5A–7B. The perspective view of FIG. 5A shows a basic structure of semiconductor test system of the present invention. As shown in FIG. 5A, pin cards 74 are arranged radially relative to the center of a test head 70. Thus, one edge (inner edge) of a pin card is positioned close to the center and another edge (outer edge) of the pin card is positioned close to the inner wall of the test head 70. The pin cards 74 are usually mounted on a backplane (FIG. 5C or 5D) in the test head 70.

On the test head 70, a load board (performance board) 80 is placed for connecting the drivers and comparators in the pin cards through a test fixture (not shown). The load board 80 mounts the DUT, to which test vectors are applied though the RTD (round-trip-delay) path from the pin cards. Although not shown in FIG. 5A, the load board 80 normally has an IC socket (test socket) thereon to place an IC device under test (DUT). Since the pin cards 74 are aligned in a radial manner relative to the center, and the drivers and comparators are formed at the inner edge of the pin cards 74, the shortest distance as well as equi-distance to the DUT can be established for all of the pin cards. In other words a length of an electrical signal oath from the driver to the DUT is minimized and equalized to the others. This is especially advantageous when high speed drivers and comparators 120 are used in the pin 74.

Figure 4A:
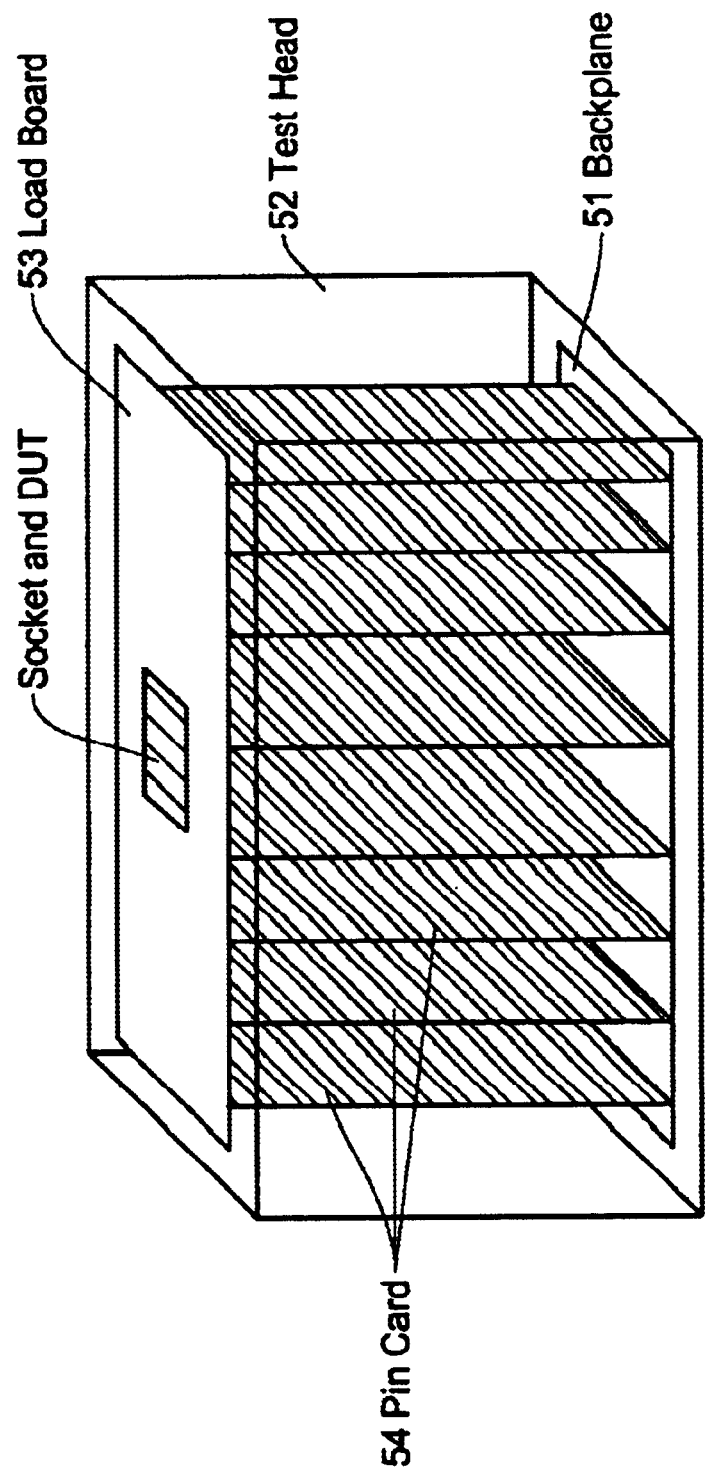
FIGS. 4A and 4B are schematic diagrams showing an example of structure in a conventional semiconductor test system having pin cards arranged in parallel in one direction in the test head where
Figure 4B:
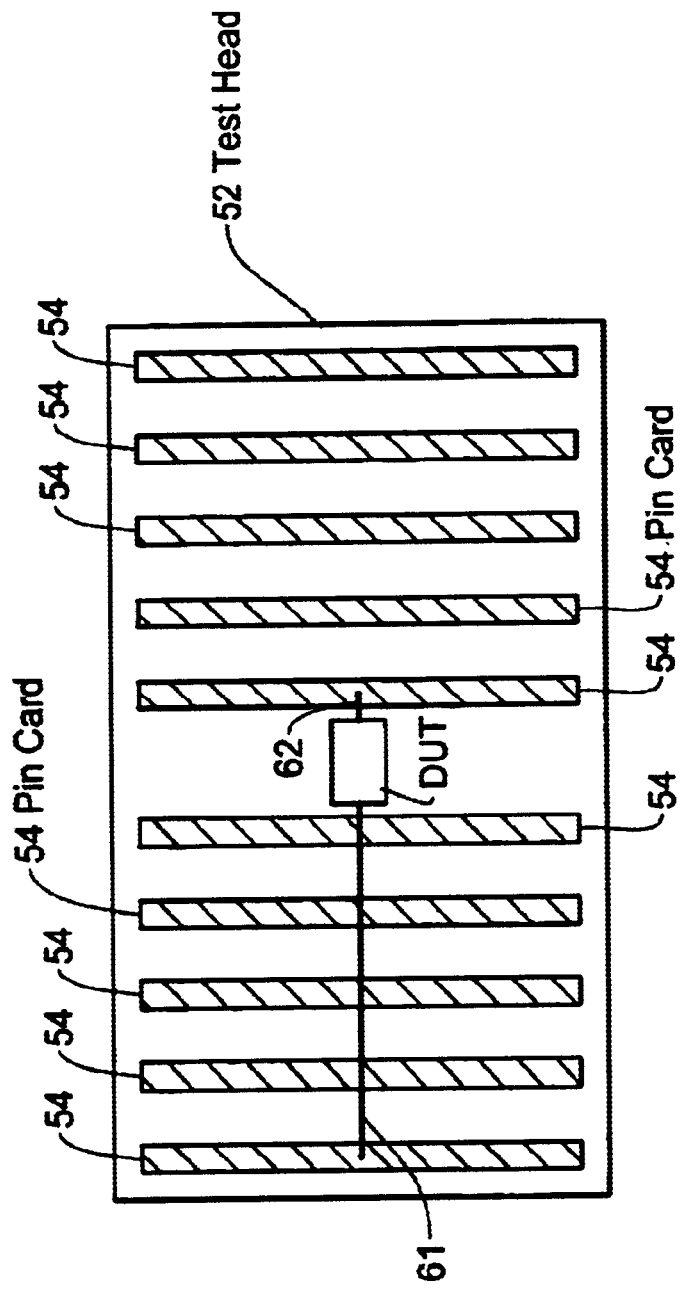

FIG. 5B is a top view showing the connection of RTD paths 64 from the pin boards 74 to the DUT. The DUT is placed at the center of the load board 80 on the test head 70. Since the pin cards 74 are arranged radially in the test head 70, the distance from the pin cards to the DUT is equal for all of the pin cards 74. This is a significant departure from the conventional art in that, as shown in FIGS. 4A and 4B, the distances between the pin cards 54 and the DUT vary significantly depending on the locations of the pin cards 54. In FIG. 5B, the RTD paths 64 between the inner edge (drivers and comparators) of the pin cards 74 and the DUT can be minimized. Because of this configuration, the RTD paths 64 are much shorter than those in the conventional art.

Figure 5C:
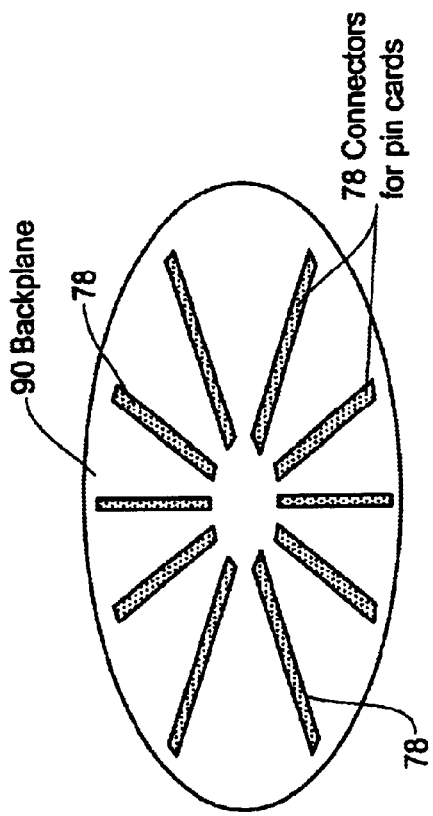

FIG. 5C and FIG. 5D show examples of backplane of the present invention for mounting the pin cards 74 in the test head 70. Typically, the back plane has a large number of connectors for receiving the pin cards and is provided at the bottom of the test head. FIG. 5C shows a backplane 90 of the present invention which is circular, and connectors 78 are radially formed thereon. FIG. 5D shows a backplane 92 of the present invention which is rectangular, and connectors 78 are radially formed thereon. The pin cards 74 will be mounted radially on the backplane by connecting with the connectors 78.

The present invention can be implemented in either of the backplane 90 or 92. The circular backplane 90 may be manufactured by smaller amount of material but the production may be more difficult and costly than the rectangular backplane 92. The rectangular backplane 92 may occupy more area in the test head than the circular backplane 90 although the production is easy. As long as the pin cards are arranged in a radial fashion, the backplane may take any forms.

Figure 1:
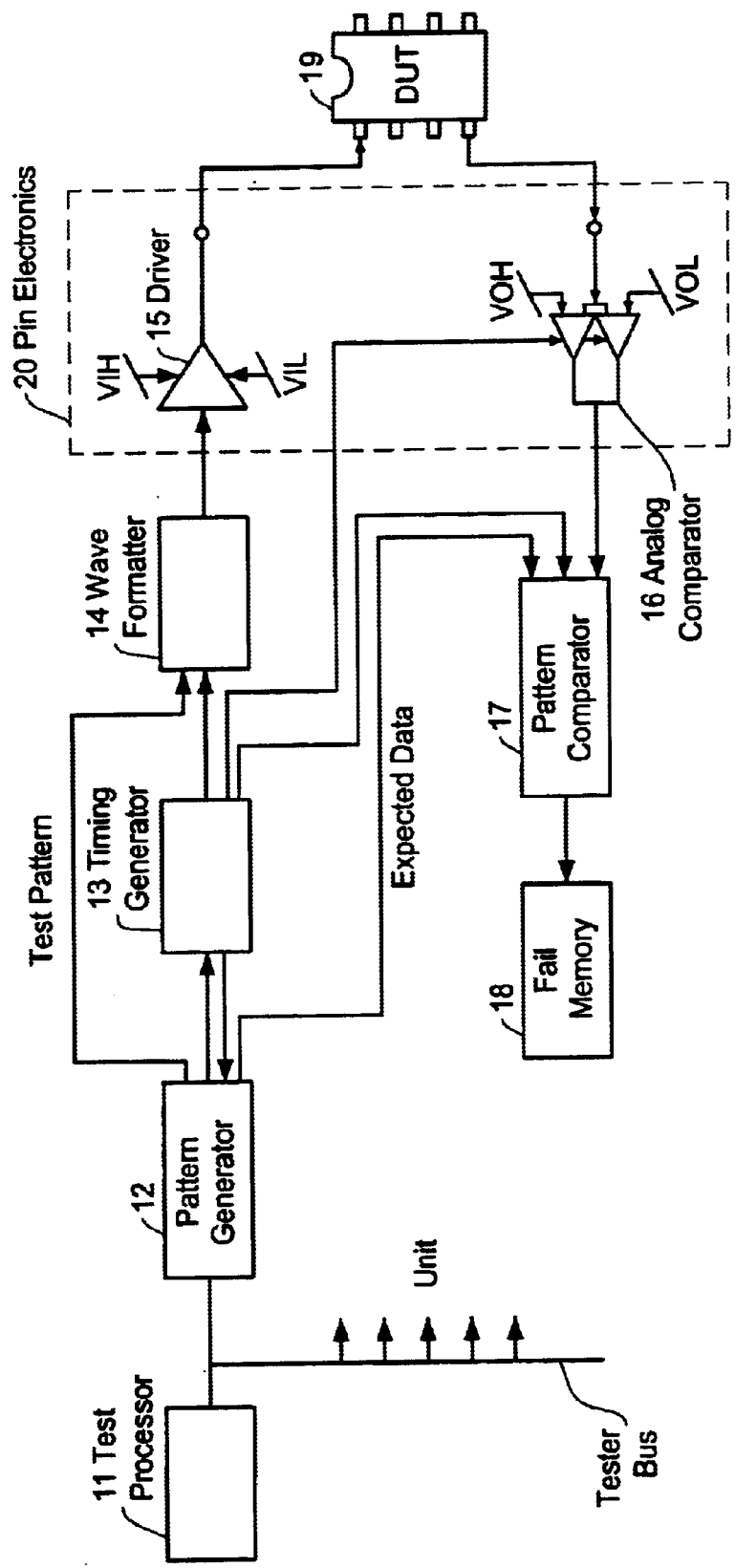
FIG. 1 is a block diagram showing an example of basic structure in a semiconductor test system.
Figure 2:
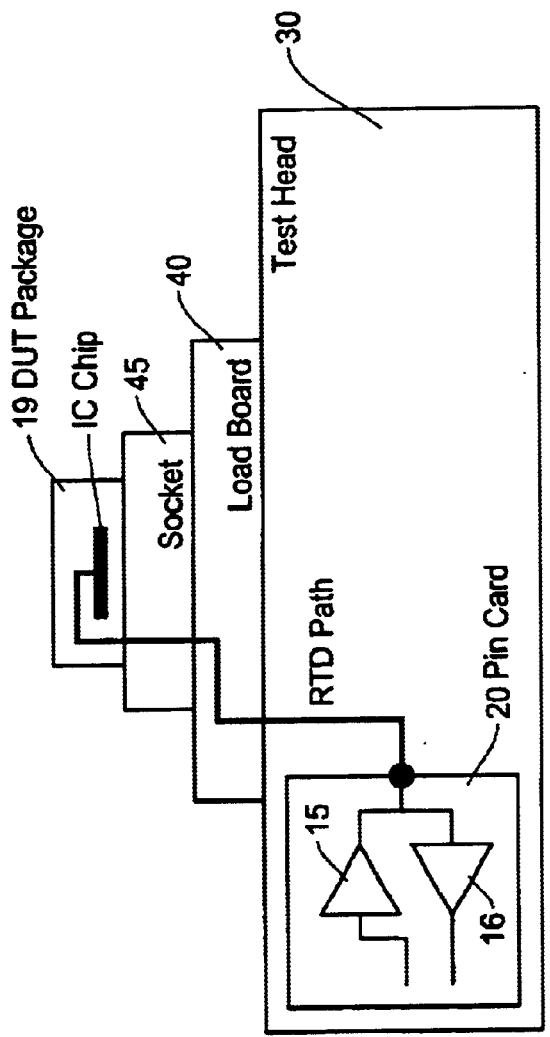
FIG. 2 is a schematic diagram showing a structure in the semiconductor test system related to a signal path between the pin cards and the IC device under test causing a round-trip-delay (RTD).

Because of the radial arrangement of the pin cards, the driver/comparator in the pin card may be arranged in such a way as to fine tune the performance of the test system. Such an example is shown in a block diagram of FIG. 6 where high speed drivers/comparators 120 and PLL (phase lock loop) circuits 122 are implemented toward the inner edge of the pin card. Here, as well known in the art, a PLL circuit is installed on the in card as a part of a timing generator (FIG. 1) or a click generator to produce a timing signal or a clock signal for a corresponding test pin such as shown in FIG. 3A.

Since the inner edge of the pin card resides close to the center of the test head, it is able to establish the shortest distance from the DUT, i.e., the smallest RTD. All other logic such a memory and a controller are implemented away from the inner edge of the pin card. This arrangement allows to position time critical components close to the DUT to reduce RTD while forming other components not so time critical on the outer edge of the pin card.

In most cases, all pin cards in a semiconductor test system have the same characteristics such as an operating speed. To establish a semiconductor test system with higher flexibility, the assignee of this invention has proposed a modular test system that contains multiple frequency test pins in U.S. patent application No. 09/434,821, now U.S. Pat. No. 6,629, 282. The present invention is advantageously applicable to implement such a modular test system by incorporating high speed, low speed, and even medium speed drivers and comparators on a pin card.

Figure 7A:
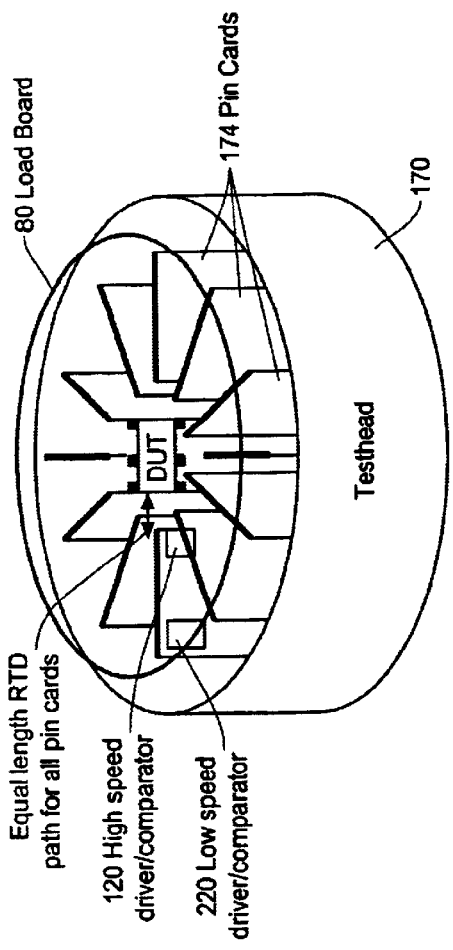
FIGS. 7A–7B are schematic diagrams showing an example of structure in the semiconductor test system of the present invention in which each pin card has different speeds of drivers/comparators where
Figure 7B:
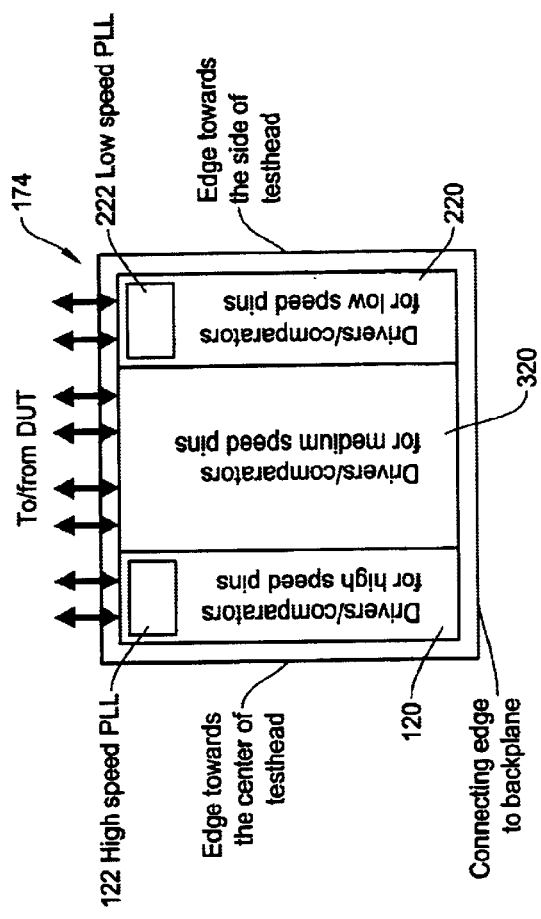

FIGS. 7A and 7B show an example of such an application where FIG. 7A shows a perspective view of the test system and FIG. 7B show a front view of the pin card 174 for the test system of FIG. 7A. Each pin card 174 includes two or more circuit configurations of pin electronics and other components shown in FIG. 1. i.e., two or more test pins as disclosed by the U.S. Pat. No. 6,629,282 noted above. High speed drivers and comparators 120 and PLL circuits 122 for a high speed test pin are formed at the inner top edge of the pin card 174 and low speed drivers and comparators 220 and PLL circuits 222 for a low speed test pin are formed at the outer edge of the pin card 174. If necessary, medium speed drivers and comparators 320 can be established about the middle of the pin card 174.

Because the high speed drivers and comparators are created close to the DUT, the length of the signal paths to and from the DUT becomes shortest. Thus, the high speed drivers and comparators requiring time critical performances can attain an intended performance level. The low speed drivers and comparators do not usually require time critical performances, thus, it is sufficient that these circuit blocks are created at the outer edge of the pin card. Further, as shown in FIG. 7B, medium speed drivers and comparators are placed at around the center of the pin card 174. This arrangement allows to establish a modular test system with different speed test pins with low cost.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A semiconductor test system for testing an IC device under test (DUT), comprising:
    a plurality of pin cards each configuring at least one test pin and having at least a driver for supplying test vectors to a DUT, a comparator for comparing an output signal of the DUT, a phase lock loop (PLL) circuit for generating a clock signal for the test pin;
    a test head for storing the plurality of pin cards therein; and
    a load board for mounting the DUT at about a center thereof, the load board being formed on the test head and electrically connected to the plurality of pin cards;
    where the pin cards are arranged in a radial manner in the test head so that an inner edge of the pin card is proximate with a center of the test head and an other edge of the pin card is proximate with a wall of the test head, and the driver, the comparator and the PLL circuit are formed in an area close to the inner edge of the pin card, thereby minimizing a round-trip-delay (RTD) between the pin card and the DUT as well as establishing equi-distance therebetween.

2. A semiconductor test system as defined in claim 1, further comprising a backplane in the test head opposite to the load board for mounting the plurality of pin cards in the radial manner.

3. A semiconductor test system as defined in claim 2, wherein the backplane has a circular shape on which a plurality of connectors for mounting the pin cards are formed in a radial fashion.

4. A semiconductor test system as defined in claim 2, wherein the backplane has a rectangular shape on which a plurality of connectors for mounting the pin cards are formed in a radial fashion.

5. A semiconductor test system as defined in claim 1, wherein the pin card has high speed drivers for supplying high speed test vectors to the DUT and high speed comparators for comparing output signals from the DUT caused by the high steed test vectors, thereby establishing high speed test pins, and low spied drivers for supplying low speed test vectors to the DUT and low speed comparators for comparing output signals from the DUT caused by the low speed test vectors, thereby establishing low speed test pins, wherein the high speed test pins and the low speed test pins are independently established from one another on the pin card.

6. A semiconductor test system as defined in claim 5, wherein the high speed drivers and comparators are formed in an area close to the inner edge of the pin card while the low speed drivers and comparators are formed away from the inner edge of the pin card.

7. A semiconductor test system as defined in claim 1, wherein the pin card has high speed drivers for supplying high speed test vectors to the DUT and high speed comparators for comparing output signals from the DUT caused by the high speed test vectors and high speed PLL circuits for generating high speed clock signals to produce the high speed test vectors, thereby establishing high speed test pins, and low speed drivers for supplying low speed test vectors to the DUT and low speed comparators for comparing output signals from the DUT caused by the low speed test vectors and low speed PLL circuits for generating low speed clock signals to produce the low speed test vectors, thereby establishing low speed test pins, and wherein the high speed drivers and comparators and PLL circuits are formed in an area closed to the inner top edge of the pin card while the low speed drivers and comparators and PLL circuits are formed away from the inner edge of the pin card, and wherein the high speed test pins and the low speed test pins are independently established from one another on the pin card.

* * * * *